(12) United States Patent
Ilkbahar

(10) Patent No.: US 6,563,745 B1
(45) Date of Patent: May 13, 2003

(54) MEMORY DEVICE AND METHOD FOR DYNAMIC BIT INVERSION

(75) Inventor: Alper Ilkbahar, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/023,466

(22) Filed: Dec. 14, 2001

(51) Int. Cl.$^7$ .............................................. G11C 16/04
(52) U.S. Cl. ........................... 365/189.07; 365/189.02; 365/236
(58) Field of Search ....................... 365/189.07, 189.02, 365/189.12, 236, 240, 230.08, 189.05

(56) References Cited

U.S. PATENT DOCUMENTS

| | | | |
|---|---|---|---|
| 4,646,266 A | 2/1987 | Ovshinsky et al. | |
| 5,835,396 A | 11/1998 | Zhang | |
| 6,034,882 A | 3/2000 | Johnson et al. | |
| 6,185,122 B1 | 2/2001 | Johnson et al. | |
| 6,198,668 B1 * | 3/2001 | Watts | 365/189.07 |
| 6,236,587 B1 | 5/2001 | Gudesen et al. | |

OTHER PUBLICATIONS

"Exotic Memories, Diverse Approaches," EDN Asia, pp. 22–33 (Sep. 2001).
"A Vertical Leap for Microchips," Thomas H. Lee, Scientific American, 8 pages (Jan. 2002; printed Dec. 10, 2001).
"Three–Dimensional Memory Array and Method of Fabrication," U.S. patent application Ser. No. 09/560,626, filed Apr. 28, 2000; inventor: Johan Knall.
"Memory Device and Method for Storing and Reading a File System Structure in a Write–Once Memory Array," U.S. patent application Ser. No. 09/877,719, filed Jun. 8, 2001; inventors: Christopher S. Moore, James E. Schneider, J. James Tringali, and Roger W. March.

"Memory Device and Method for Storing and Reading Data in a Write–Once Memory Array," U.S. patent application Ser. No. 09/877,720, filed Jun. 8, 2001; inventors: Christopher S. Moore, James E. Schneider, J. James Tringali, and Roger W. March.

"Memory Device and Method for Sensing while Programming a Non–Volatile Memory Cell," U.S. patent application Ser. No. 09/896,815, filed Jun. 29, 2001; inventors: Bendik Kleveland, James M. Cleeves, and Roy E. Scheuerlein.

"Method and System for Increasing Programming Bandwidth in a Non–Volatile Memory Device," U.S. patent application Ser. No. 09/895,960, filed Jun. 29, 2001; inventors: Christopher S. Moore, Bendik, Kleveland, Roger W. March, James M. Cleeves, and Roy E. Scheuerlein.

* cited by examiner

Primary Examiner—David Lam
(74) Attorney, Agent, or Firm—Brinks Hofer Gilson & Lione

(57) ABSTRACT

A memory device and method for storing bits in a memory array is provided. In one preferred embodiment, a memory device is provided comprising a plurality of memory cells that are in a first digital state and can be switched to a second digital state. A plurality of bits to be stored in the memory array are provided, and if the plurality of bits comprise more bits in the second digital state than in the first digital state, the plurality of bits are inverted before being stored in the memory array. In another preferred embodiment, a memory device is provided comprising a memory array and bit inversion circuitry. In yet another preferred embodiment, a plurality of bits are inverted before being stored in a memory array if the plurality of bits comprise more bits in a non-preferred digital state than in a preferred digital state.

50 Claims, 3 Drawing Sheets

MEMORY DEVICE AND METHOD FOR DYNAMIC BIT INVERSION

BACKGROUND

In some memory arrays, an initial state of a memory cell is known before a write operation. For example, the initial state of a write-once memory cell is its un-programmed state (e.g., Logic 1). During a write operation, the initial state of a memory cell is switched to a different state when that memory cell is programmed with a value different from that represented by its initial state (e.g., Logic 0). Often, data to be stored in a memory array includes bits that are of the same value as the initial state of the memory cells. Although storage of those bits does not involve switching the digital state of a memory cell, with some programming methods, the same amount of programming time is spent storing those bits as is spent storing bits of the opposite value. By not taking advantage of the known initial state of the memory array, bandwidth and power are unduly consumed.

There is a need, therefore, for a memory device and method that can be used to improve write bandwidth and power for memories with known initial states.

SUMMARY

The present invention is defined by the following claims, and nothing in this section should be taken as a limitation on those claims.

By way of introduction, the preferred embodiments described below provide a memory device and method for storing bits in a memory array. In one preferred embodiment, a memory device is provided comprising a plurality of memory cells that are in a first digital state and can be switched to a second digital state. A plurality of bits to be stored in the memory array are provided, and if the plurality of bits comprise more bits in the second digital state than in the first digital state, the plurality of bits are inverted before being stored in the memory array. In another preferred embodiment, a memory device is provided comprising a memory array and bit inversion circuitry. In yet another preferred embodiment, a plurality of bits are inverted before being stored in a memory array if the plurality of bits comprise more bits in a non-preferred digital state than in a preferred digital state. Other preferred embodiments are provided, and each of the preferred embodiments described below can be used alone or in combination with one another.

The preferred embodiments will now be described with reference to the attached drawings.

DETAILED DESCRIPTION OF THE PRESENTLY PREFERRED EMBODIMENTS

By way of overview, the preferred embodiments described herein relate to memory arrays with a plurality of memory cells that are in a first digital state (e.g., Logic 1 (or Logic 0)) and can be switched to a second digital state (e.g., Logic 0 (or Logic 1)). When the memory cells take the form of write-once memory cells, the first digital state is the initial un-programmed state of the memory; cells, and the second digital state is the programmed state of the memory cells. When the memory cells take the form of write-many memory cells, the first digital state is the state (e.g., Logic 0 or Logic 1) before a write operation of the memory cells that will be used to store a plurality of bits. When a bit in the second digital state is stored in the memory array, a programming pulse is applied to a memory cell for a sufficient duration to switch the memory cell from the first digital state to the second digital state. Although not required, the memory array preferably takes advantage of the known initial state of the memory array to spend less time storing a bit in the first digital state than in storing a bit in the second digital state. For example, memory cells that are to store a bit in the first digital state can be "skipped" during a write operation since those memory cells are already in the first digital state. This reduces overall programming time and power and, accordingly, improves write bandwidth and power consumption.

Figure 1:
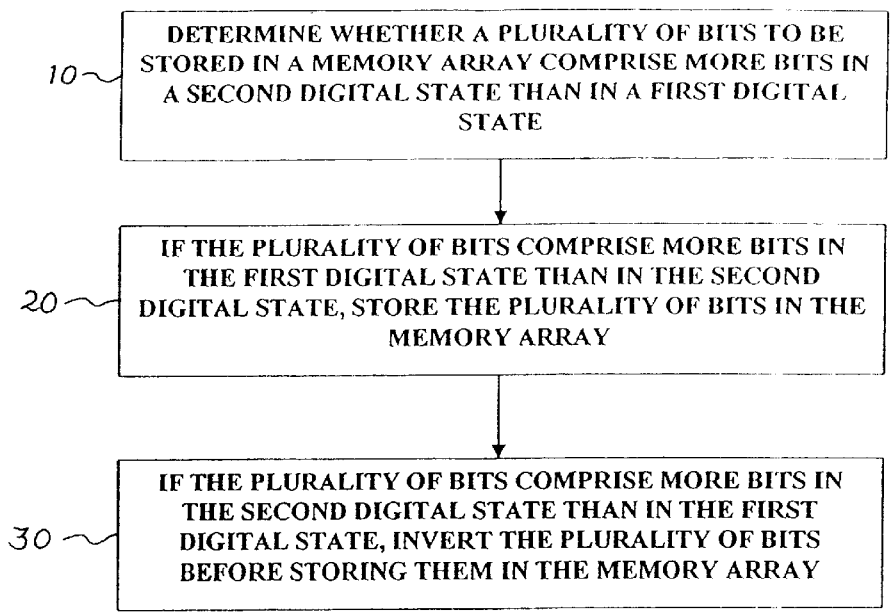
FIG. 1 is a flow chart of a method of a preferred embodiment for storing bits in a memory array.

In this preferred embodiment, bits are stored in the memory array according to the method shown in the flow chart of FIG. 1. When a plurality of bits are to be stored in the memory array, it is first determined whether the plurality of bits comprise more bits in the second digital state than in the first digital state (act 10). If the plurality of bits comprise more bits in the first digital state than in the second digital state, the plurality of bits are simply stored in the memory array (act 20). However, if the plurality of bits comprise more bits in the second digital state than in the first digital state, the plurality of bits are inverted before being stored in the memory array (act 30). This operation will be referred to herein as "dynamic bit inversion." (If the plurality of bits comprise an equal number of bits in the first and second digital states, those bit can either be stored as-is or inverted and then stored.) Preferably, data (i.e., one or more bits) is stored along with the plurality of bits to indicate whether the plurality of bits were stored in an inverted state. This data will be referred to herein as "dynamic bit inversion (DBI) information." Preferably, the DBI information covers as large an amount of data as possible to reduce overhead. When a plurality of stored bits are read from the memory array, the DBI information is checked to determine whether the,read bits were inverted before storage. If the bits were inverted before storage, the read bits are inverted to place the bits back in a non-inverted state. If the bits were not inverted before storage, the read bits are simply outputted without inversion.

By inverting a plurality of bits if they contain more bits with a value opposite that of the initial condition of the storage elements, write bandwidth and power can be improved. Consider, for example, a memory array in which the initial digital state is 1 and memory cells that are to store a bit with a value of 1 are skipped during programming. The worst-case scenario for bandwidth and power for this memory array is when a plurality of bits comprising all 0s (e.g., a byte of data with a value 00h) is written. Because the data only contains 0s, no improvement in bandwidth or power is realized since no memory cells are skipped. However, if dynamic bit inversion were used, the plurality of bits would be inverted to all 1s (e.g., the byte of data would be inverted to ffh). Since the memory cells already contain the value 1, the memory cells would be skipped, and very little (if any) programming time would be spent, thereby achieving the highest possible improvement in bandwidth and power consumption. The average bandwidth improvement is a function of the data pattern being stored and will typically be less than the improvement realized in the best-case scenario. The "worst-case" scenario for memory arrays using dynamic bit inversion would be realized when data to be stored contains an equal number of 0s and 1s because no bandwidth savings are realized. One would expect to find such a worst-case scenario with compressed files, such as jpg and mp3 files, because those files should contain an equal number of 0s and 1s. However, an analysis of sample jpg and mp3 files showed programming time improvements of ~5% for jpg files and over 15% for mp3 files. The range of improvement for more than 100 jpg files varied from 0.4% to 11.5%. Accordingly, even compressed files can benefit from dynamic bit inversion. Other types of files, such as data structures and executable code, are expected to show an even greater rate of improvement from dynamic bit inversion.

Dynamic bit inversion provides advantages even when the memory array spends the same amount of time storing a bit in the first digital state as it does storing a bit in the second digital state (e.g., when memory cells storing a 1 are not skipped). One such benefit is the power savings realized during memory reads. With some memory arrays, peak read power is set by the number of programmed memory cells in an array due to the leakage of programmed memory cells, which can be about two times that of un-programmed memory cells. By using dynamic bit inversion, the peak read power consumption can be reduced in half.

Each of the acts in the method described above can be implemented in a variety of ways. For example, the act of inverting can be performed by a memory device or by a host device providing bits to the memory device. Additionally, the inversion operation can be distributed between the memory device and the host device. Similarly, the determination of whether the plurality of bits comprise more bits in the second digital state than in the first digital state can be made by the memory device or by the host device, or the act of determining can be distributed between the memory device and the host device. The determination of whether the plurality of bits comprise more bits in the second digital state than in the first digital state can be made by counting the number of bits in the first and/or second digital states. For example, for a given plurality of bits, only the number of 1s can be counted, only the number of 0s can be counted, or the number of 1s and 0s can both be counted. When the host device performs some or all of the determining functionality, it can provide a command regarding inversion to the memory device (e.g., invert these bits, do not invert these bits). Alternatively, the host device can report the results of its determination (e.g., the number of bits in the first and/or second digital states, whether there were more bits of one digital state versus the other, etc.), and the memory device can make the decision regarding inversion based on that information. Additionally, the act of determining whether the plurality of bits comprise more bits in the second digital state than in the first digital state can be subsumed in another act. For example, this act is performed during the act of determining whether the number of bits in the second digital state is greater than or equal to (instead of just greater than) the number of bits in the first digital state.

Figure 2:
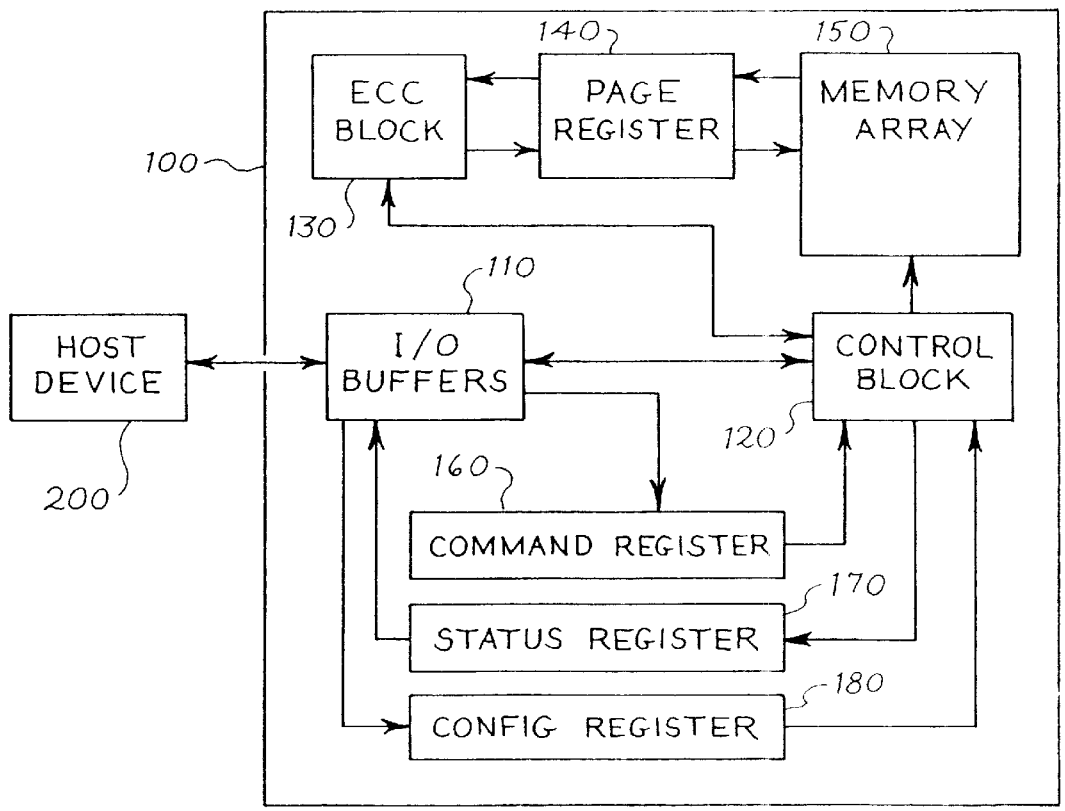
FIG. 2 is a block diagram of a memory device coupled with a host device of a preferred embodiment.

Turning again to the drawings, FIG. 2 shows a memory device 100 of a preferred embodiment coupled with a host device 200. As used herein, the term "coupled with" means directly coupled with or indirectly coupled with through one or more named or unnamed components. As shown in FIG. 2, the memory device 100 comprises I/O buffers 110, a control block 120, an error correcting code ("ECC") block 130, a page register 140, a memory array 150, a command register 160, a status register 170, and a configuration register 180. In this preferred embodiment, the memory array 150 comprises a three-dimensional array of write-once memory cells whose initial digital state is Logic 1. The command register 160 passes commands (e.g., read, write) received from the host device 200 to the control block 120, the status register 170 holds information from the control block 120 regarding the status of certain operations (e.g., a failure during a write operation), and the configuration register 180 can be used during a test operation to instruct the control block 120 to disable ECC syndrome bit generation.

The page register 140 is a buffer structure between the memory array 150 and a Smart Media Interface (SMI) in communication with the host device 200. Bits are read from and stored in the memory array 150 a page-at-a-time, and the page register 140 holds a page of memory that is going to be stored in the memory array 150. The page register 140 also holds a page of memory that is read from the memory array 150. In this preferred embodiment, a page of memory comprises 512 bytes of main data and 64 bytes of ECC syndrome bits for that data. During a write operation, 512 bytes of data and 64 bytes of ECC syndrome bits are assembled in the page register 140 before being written into the memory array 150. In operation, the I/O buffers 110 temporarily store the incoming bytes and pass them to the control block 120. The control block 120 comprises an oct-byte register 125 (see FIGS. 4 and 5) that can hold eight bytes of data, which is referred to herein as an "oct-byte." When eight bytes are stored in the oct-byte register 125, the oct-byte is sent from the oct-byte register 125 to the ECC block 130, which generates a byte of ECC syndrome bits for the oct-byte. The oct-byte and its ECC syndrome byte (together, the ECC word) are then stored in the page register 140. The page register 140 is populated one oct-byte at a time until it is full (i.e., until 64 ECC words are stored in the page register 140). The contents of the page register 140 are then transferred to the memory array 150 one byte at a time. (Partial page writes, where the contents of the page register 140 are transferred: to the memory array 150 before the page register 140 is completely full, can also be implemented.) During a read operation, 512 bytes of main data and 64 bytes of ECC syndrome bits are read from the memory array 150 into the page register 140 and are then serially pushed out from the SMI to the host device 200.

Figure 3:
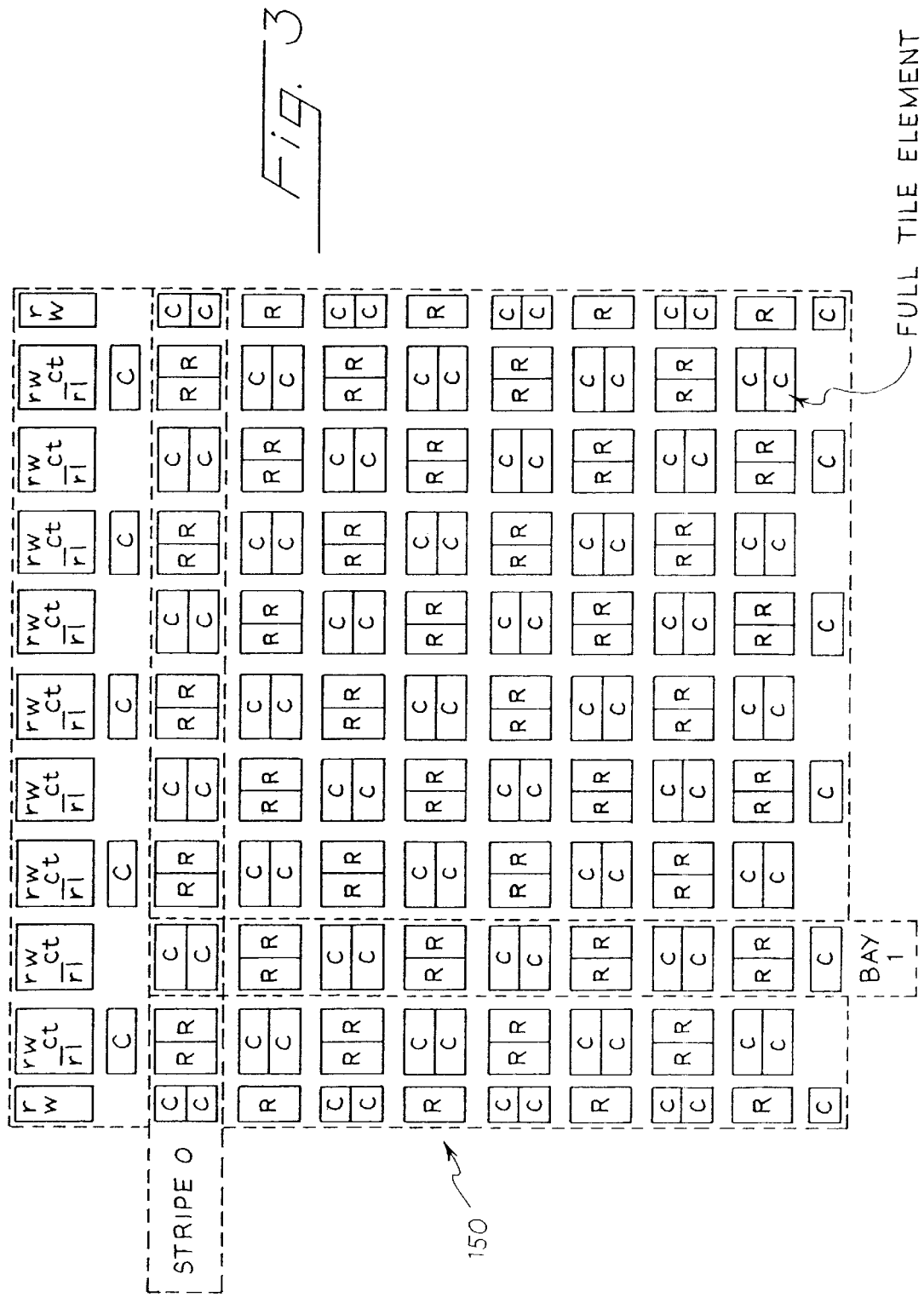
FIG. 3 is an illustration of a memory array of the memory device of FIG. 2.

Returning to the drawings, FIG. 3 is an illustration of the memory array 150. The memory array 150 comprises 88 sub-arrays (or "tiles"). As used herein, the term sub-array refers to a contiguous group of memory cells having contiguous word and bit lines generally unbroken by decoders, drivers, sense amplifiers, and input/output circuits. The core of the memory array 150 is 72 full tile elements organized in an array of eight rows (which will be referred to herein as "stripes") and nine columns (which will be referred to herein as "bays"). In this preferred embodiment, the silicon real estate under the sub-arrays is used for non-memory logic circuits, such as row and column decoders. As shown in FIG. 3, the row and column decoders, which are designated by "R"s and "C"s, respectively, are arranged under the memory array 150 in a checkerboard style to provide for a high density layout. More details on this arrangement can be found in "Memory Device with Row and Column Decoder Circuits Arranged in a Checkerboard Pattern under a Plurality of Memory Arrays," U.S. patent application Ser. No.

09/896,814, which is assigned to the assignee of the present invention and is hereby incorporated by reference. Further information about the memory array 150 and its operation can be found in "Memory Device and Method for Storing Bits in Non-Adjacent Storage Locations in a Memory Array," U.S. patent application Ser. No. 10/024,647, which is assigned to the assignee of the present application and is hereby incorporated by reference.

In this preferred embodiment, the memory device 100 also comprises bit inversion circuitry operative to determine whether a plurality of bits comprise more bits in the second digital state (here, Logic 0) than in the first digital state (here, Logic 1) and to invert the plurality of bits before they are stored in the memory array if the plurality of bits comprise more bits in the second digital state than in the first digital state. As used herein, the term "bit inversion circuitry" refers to any component or components that perform the functions described in the preceding sentence. "Bit inversion circuitry" is not limited to the structure described below and its equivalents, which is presented merely to illustrate a presently preferred implementation. Further, the "bit inversion circuitry" can perform addition functions. For example, the bit inversion circuitry can also invert a plurality of bits read from the memory array if those bits were stored in an inverted form.

Figure 4:
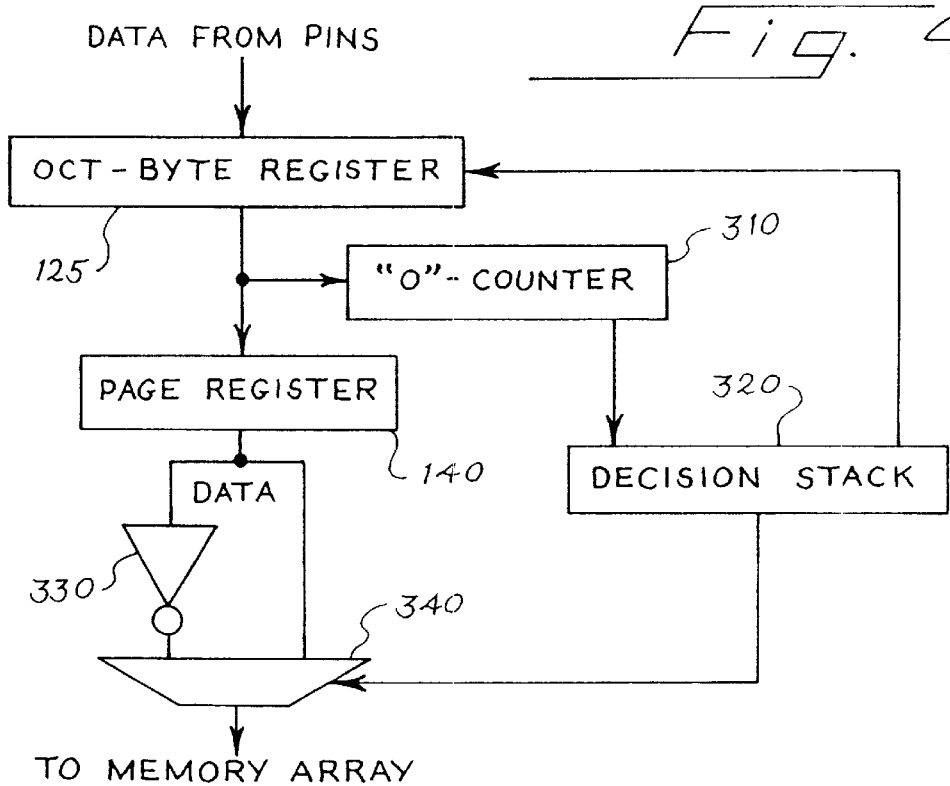
FIG. 4 is a block diagram illustrating a write operation of a preferred embodiment.

FIG. 4 shows components of bit inversion circuitry of one presently preferred embodiment. As shown in FIG. 4, the bit inversion circuitry comprises a "0"-counter 310, a decision stack 320, an inverter 330, and a multiplexor 340. In operation, when the oct-byte register 125 is filled, the 0-counter 310 counts the number of 0s in the oct-byte and reports the number of 0s counted every two oct-bytes. If this number exceeds 64, the data in those two oct-bytes should be inverted; otherwise, the data should be preserved as is. The decision about inverting data is stored in the decision stack 320, which is a 32-deep stack memory element (there are 32 oct-byte pairs in a page). Once the whole page is stored in the page register 140, control logic writes the contents of the decision stack 320 into the page register 140. In this preferred embodiment, one bit is used to indicate whether an oct-byte pair is inverted, and this bit is protected using three-way redundancy. (Three-way redundancy provides a mechanism for error checking with the least amount of overhead.) Accordingly, the DBI information comprises 96 bits (12 bytes) of data. To avoid an additional write cycle, it is preferred that the DBI information be stored in the page register 140 during the same write cycle that is used to store information for redundancy/self-repair operations, as described in "Memory Device and Method for Redundancy/Self-Repair," U.S. patent application Ser. No. 10/024,646, which is assigned to the assignee of the present application and is hereby incorporated by reference. To provide even greater improvement in bandwidth, the 0-counter 310 can be designed to count the number of 0s in the DBI information for an oct-byte pair along with the number of 0s in that oct-byte pair.

Preferably, the main data and the DBI information are stored in the page register 140 using the "bit sprinkling" techniques described in "Memory Device and Method for Storing Bits in Non-Adjacent Storage Locations in a Memory Array," U.S. patent application Ser. No. 10/024,647, which is assigned to the assignee of the present application and is hereby incorporated by reference. In general, bit sprinkling can be used, to store adjacent bits in a data stream in non-adjacent storage locations in the memory array. The DBI information is preferably stored in the reserved area R of the spare array, as described in the above-referenced patent application.

As the contents of the page register 140 are being written into the memory array 150, the contents of the decision stack 320 control the multiplexor 340 to select between the original form of the data (from the page register 140) and the inverted form of the data (from the inverter 330). When the bit sprinkling technique is used, the page register 140 outputs bits from eight different oct-bytes at a time. Accordingly, four bits from the decision stack 320 are provided to the page register 140 to control the multiplexor 340. The decision stack 320 is incremented every eighth cycle by four. Preferably, the programming techniques described in the follow two patent applications are used: "Method and System for Increasing Programming Bandwidth in a Non-Volatile Memory Device," U.S. patent application Ser. No. 09/895,960, and "Memory Device and Method for Sensing while Programming a Non-Volatile Memory Cell," U.S. patent application Ser. No. 09/896,815, both of which are assigned to the assignee of the present application and are hereby incorporated by reference. Those techniques can be used to reduce the overall programming time and power by "skipping" memory cells that do not need to be programmed and/or by sensing the condition of the memory cell during the write operation. Once the write cycle is completed, the memory array 150 will contain the page of main data and the DBI information, which will be used during a read operation.

Figure 5:
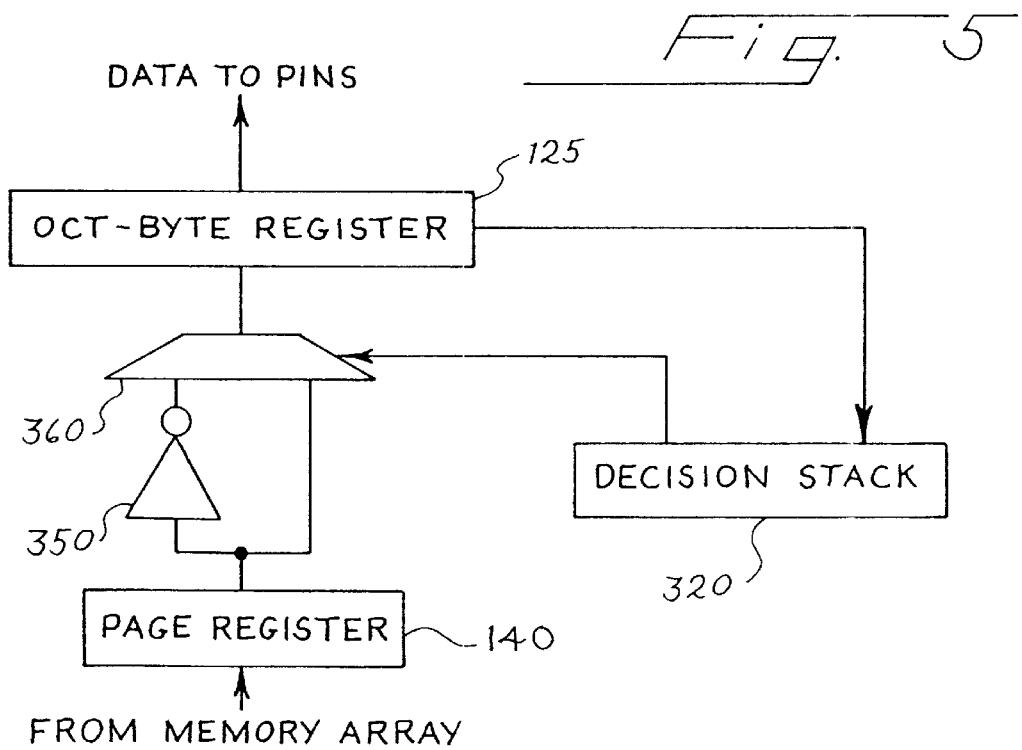
FIG. 5 is a block diagram illustrating a read operation of a preferred embodiment.

FIG. 5 will now be described to illustrate a read operation. In this preferred embodiment, a second inverter 350 and multiplexor 360 are used; however, the memory device 100 can be designed to use the same inverter 330 and multiplexor 340 that are shown in FIG. 4. A read operation begins with the transfer of the data from the memory array 150 into the page register 140. During this period, the DBI information stored earlier will also be pulled out of the memory array 150 and stored in the page register 140. The second step of a read operation is to: transfer data from the page register 140 into the oct-byte register 125. In this preferred embodiment, ECC detection and correction occurs during this cycle. Accordingly, before this step is taken, the DBI information in the page register 140 is transferred into the decision stack 320. This transfer will involve a majority voting scheme to take advantage of the three-way redundancy of the DBI information. As the data is being moved from the page register 140 to the oct-byte register 125, the decision stack 320 will be incremented every cycle, and its output will control the multiplexor 360. This will guarantee that the ECC block 130 sees the correct polarity of the data. It is preferred that the decision stack timing be designed such that the control path timing does not exceed the data path timing.

There are several alternatives that can be used with these preferred embodiments. As noted above, it is preferred that the DBI information cover as large an amount of data as possible to reduce overhead. With the implementation described above, it would be preferred that the DBI information cover a fill page of data because all writes to the memory happen across a full page. However, this implementation also provides for partial page writes (i.e., writing the contents of the page register 140 to the memory array 150 before the page register 140 is completely full), and no indication is provided regarding whether a write operation is a partial page write or a full page write. During partial page writes, limited sections of a page are written to memory by padding the untouched locations with 1s. In this way, one can write, for example, the first 60% of a full page with one page write command and then write the remaining 40% with a second page write command. If DBI information covered an entire page and the first write contained 60% 0s, the bit inversion circuitry would invert all of the bits in the page, creating a mix of 60% 1s and 40% 0s. The 40% 0s would fill the section that should have remained in the "virgin" state during a partial page write, thereby making any further writes to that section impossible. Accordingly, in the presently preferred implementation, the DBI information covers less than a full page of data.

The DBI information can cover an individual oct-bytes, which is the minimum amount of data allowed to be written at a time in the presently preferred implementation. This solves the partial page problem described above. However, in the presently preferred implementation, there is only about 12 bytes of free space per each page in the memory array 150, and the storage space for the DBI information covering one oct-byte would be at least 24 bytes per page if three-way redundancy were used (there are 64 oct-bytes per page). By making the inversion decision across two oct-bytes instead of one oct-byte, the overhead of storing the DBI information is reduced by 50%. (It is presently preferred that the number of oct-bytes to be examined not extend beyond two.) As discussed above, if two oct-bytes are examined at a time and more than 50% of the bits are 0s, both oct-bytes being examined contain valid data and are not designed to be overridden by a subsequent partial page write (i.e., the oct-bytes are not designed to be partial page "padding"). Furthermore, if all oct-byte pairs in a page are guaranteed to have fewer than 50% 0s through dynamic bit inversion, the whole page is guaranteed not to have fewer than 50% 0s as well. Accordingly, the goals of dynamic bit inversion can be achieved with the least amount of overhead.

The case of a partial page write when the DBI information covers two oct-bytes is as described above. Checking across two oct-bytes guarantees that a padded oct-byte will not be inverted. However, one should realize that it is conceivable to fill the memory array 150 with 0s through multiple partial page writes (as few as two) by writing 0s into every other oct-byte. Each write will still occur at the minimum bandwidth and power savings. Also, it is possible to fill individual sub-arrays of the memory array 150 with 0s even with full-page writes due to bit sprinkling. Again, overall bandwidth and power savings will be realized across the whole page.

As discussed above, the memory device 100 can implement redundancy/self-repair operations, as described in "Memory Device and Method for Redundancy/Self-Repair," U.S. patent application Ser. No. 10/024,646, which is assigned to the assignee of the present application and is hereby incorporated by reference. At the point that a self-repair is triggered during a partial page write (a full page write is a sub-category of this discussion), the page register 140 and the decision stack 320 are expected to contain the data and the DBI information for the partial page. By virtue of the dynamic bit inversion design, the DBI information pertains to only the oct-bytes that are being written during the current write operation, and any oct-bytes that have been written earlier will be in their default state. When the self-repair operation is triggered due to write fault, first the existing page will be copied into the page.register 140, including the DBI information about the data already written in the memory array 150. At the end of the page reconstruction process, the page register 140 will contain the data and the DBI information for the current page and whatever was written into that page earlier. The decision stack 320 contains only information about the current page. The final stage in the self-repair process is the write-back operation. At that point, the write operation will look exactly as a regular write.

Although the decision stack 320 contains information about only the current page, that information is sufficient to complete the write operation, as the previously-written data must not be inverted. Later, when the repaired page is read back, data land the DBI information from both the last and any earlier partial writes will come together without any confusion. In summary, the self-repair operation described in the above-reference patent application does not need to be modified for dynamic bit inversion.

There are several alternatives that can be used with these preferred embodiments. In one alternate embodiment, dynamic bit inversion is used to invert a plurality of bits if they contain more bits in a "non-preferred" digital state than in a "preferred" digital state. A "preferred" digital state can be Logic 1 or Logic 0 depending on the characteristic targeted for improvement. For example, in the embodiments described above, it was desired to improve write bandwidth and power. Accordingly, the preferred digital state was Logic 1—the value of the initial condition of the storage elements. However, other characteristics can be targeted for improvement. For example, to improve performance and reliability of a memory device, the preferred digital state can be designated as the state that would result in fewer operations being performed to the memory cells. When read, write, and erase (for write-many memory cells) operations are performed to a non-volatile memory cell, the physical properties of that memory cell (and sometimes its neighbors) are changed. Repeated operations to a given memory cell can, therefore, have the effect of "wearing out" that memory cell and its neighbors. By designated the preferred digital state as the state that would result in fewer operations being performed to the memory cells, performance and reliability of the memory device can be improved by reducing the likelihood of memory cell wear-out. As another example, the preferred digital state can be designated as the state that would result in less leakage current. This too would improve the performance and reliability of the memory device.

In one of the preferred embodiments described above, dynamic bit inversion was used with bit sprinkling. Because the decision of whether to invert the bits was made on two oct-bytes and the bits of those two oct-bytes were sprinkled in different sub-arrays, it can be difficult to optimize reliability of a given sub-array using dynamic bit inversion in that embodiment. Accordingly, if it is desired to optimize reliability of a sub-array, it may be preferred not to use the bit sprinkling functionality.

These preferred embodiments can be implemented with any suitable memory device, such as a solid-state memory device (i.e., a memory device that responds to electrical read and write signals to cause digital information to be read from and stored in a memory array of the device), a magnetic storage device (such as a hard drive), or an optical storage device (such as a CD or DVD). As described above, the memory cells can be write-once or write-many and can be organized in a two-dimensional or three-dimensional array. In one preferred embodiment, the memory device takes the form of a solid-state memory device having a three-dimensional array of write-once memory cells, as described in U.S. Pat. No. 6,034,882 to Johnson et al., U.S. Pat. No. 5,835,396 to Zhang, and U.S. patent application Ser. No. 09/560,626, all of which are hereby incorporated by reference. As discussed in those documents, three-dimensional memory arrays provide important economies in terms of reduced size and associated reductions in manufacturing cost. Whether two-or three-dimensional, the memory array preferably comprises non-volatile passive element memory cells. Although any suitable type of memory cell can be used, in one preferred embodiment, the memory cell comprises an anti-fuse and a diode. The memory array can be made from any suitable material. In one preferred embodiment, the memory array comprises a semiconductor material. Other materials can be used, such as, but not limited to, phase-change materials and amorphous solids as well as those used with MRAM and organic passive element arrays, as described in U.S. Pat. No. 6,055,180, which is hereby incorporated by reference. It is important to note that the following claims should not be read as requiring a specific type of memory device (e.g., write-once or write-many) or specific type of memory array (e.g., two-dimensional or three-dimensional) unless explicitly recited therein.

In one preferred embodiment, the memory device takes the form of a modular, compact, handheld unit, such as a memory card or stick, that comprises an external electrical connector that can be coupled with a host device, such as a digital camera, digital audio player, or other portable consumer product.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another.

What is claimed is:

1. A method for storing bits in a memory array, the method comprising:
   (a) providing a plurality of bits to be stored in a memory array comprising a plurality of memory cells that are in a first digital state and that can be switched to a second digital state;
   (b) determining whether the plurality of bits comprise more bits in the second digital state than in the first digital state; and
   (c) if the plurality of bits comprise more bits in the second digital state than in the first digital state:
      (c1) inverting the plurality of bits; and
      (c2) storing the inverted plurality of bits in the memory array.

2. The invention of claim 1, wherein act (b) is performed by a memory device comprising the memory array.

3. The invention of claim 1, wherein the memory array is part of a memory device coupled with a host device, and wherein act (b) is performed by the host device.

4. The invention of claim 1, wherein act (c1) is performed by a memory device comprising the memory array.

5. The invention of claim 1, wherein the memory array is part of a memory device coupled with a host device, and wherein act (c1) is performed by the host device.

6. The invention of claim 1, further comprising:
   (d) if the plurality of bits comprise more bits in the first digital state than in the second digital state, storing the plurality of bits in the memory array without inverting the plurality of bits.

7. The invention of claim 1, further comprising:
   (d) if the plurality of bits comprise an equal number of bits in the first and second digital.states, storing the plurality of bits in the memory array without inverting the plurality of bits.

8. The invention of claim 1, further comprising,
   (d) if the plurality of bits comprise an equal number of bits in the first and second digital states:
      (d1) inverting the plurality of bits; and
      (d2) storing the inverted plurality of bits in the memory array.

9. The invention of claim 1, wherein less programming time is spent storing a bit in the first digital state than in storing a bit in the second digital state.

10. The invention of claim 1, wherein (c2) comprises programming memory cells associated with bits in the second digital state and skipping memory cells associated with bits in the first digital state.

11. The invention of claim 1, further comprising:
   (c3) storing data in the memory array indicating that the plurality of bits were stored in an inverted state.

12. The invention of claim 1, further comprising:
   (c3) reading the inverted plurality of bits from the memory array; and
   (c4) inverting the inverted plurality of bits read from the memory array.

13. The invention of claim 1, wherein the plurality of bits comprise a page.

14. The invention of claim 1, wherein the plurality of bits comprise two oct-bytes.

15. The invention of claim 1, wherein the plurality of bits comprise a minimum amount of data that can be written to the memory array.

16. The invention of claim 1, wherein the plurality of memory cells comprise write-once memory cells, wherein the first digital state comprises an initial un-programmed state of the write-once memory cells, and wherein the second digital state comprises a programmed state of the write-once memory cells.

17. The invention of claim 1, wherein the memory array comprises a three-dimensional memory array.

18. The invention of claim 1, wherein the plurality of memory cells are made from a semiconductor material.

19. A memory device comprising:
   a memory array comprising a plurality of memory cells that are in a first digital state and that can be switched to a second digital state; and
   bit inversion circuitry coupled with the memory array, the bit inversion circuitry being operative to determine whether a plurality of bits comprise more bits in the second digital state than in the first digital state and being further operative to invert the plurality of bits before they are stored in the memory array if the plurality of bits comprise more bits in the second digital state than in the first digital state.

20. The invention of claim 19, wherein the bit inversion circuitry comprises an inverter, a multiplexor, a counter, and a decision stack.

21. The invention of claim 19, wherein the bit inversion circuitry is further operative to invert the stored inverted plurality of bits when they are read from the memory array.

22. The invention of claim 19, further comprising a page register coupled with the bit inversion circuitry.

23. The invention of claim 22, further comprising an oct-byte register coupled with the page register.

24. The invention of claim 19, wherein the plurality of memory cells comprise write-once memory cells, wherein the first digital state comprises an initial un-programmed state of the write-once memory cells, and wherein the second digital state comprises a programmed state of the write-once memory cells.

25. The invention of claim 19, wherein the memory array comprises a three-dimensional memory array.

26. The invention of claim 19, wherein the plurality of memory cells are made from a semiconductor material.

27. A memory device comprising:
a memory array comprising a plurality of memory cells that are in a first digital state and that can be switched to a second digital state; and
means for determining whether a plurality of bits comprise more bits in the second digital state than in the first digital state and for inverting the plurality of bits before they are stored in the memory array if the plurality of bits comprise more bits in the second digital state than in the first digital state.

28. The invention of claim 27, wherein the means comprises an inverter, a multiplexor, a counter, and a decision stack.

29. The invention of claim 27, further comprising a page register coupled with the means for determining and inverting.

30. The invention of claim 29, further comprising an oct-byte register coupled with the page register.

31. A method for storing bits in a memory array, the method comprising:
(a) providing a plurality of bits to be stored in a memory array comprising a plurality of memory cells that are in a first digital state and that can be switched to a second digital state;
(b) determining whether the plurality of bits comprise more bits in a non-preferred digital state than in a preferred digital state; and
(c) if the plurality of bits comprise more bits in the non-preferred digital state than in the preferred digital state:
  (c1) inverting the plurality of bits; and
  (c2) storing the inverted plurality of bits in the memory array.

32. The invention of claim 31, wherein the preferred digital state comprises the first digital state.

33. The invention of claim 31, wherein the preferred digital state comprises the second digital state.

34. The invention of claim 31, wherein the preferred digital state improves the performance of the memory device.

35. The invention of claim 31, wherein the preferred digital state improves write bandwidth of the memory device.

36. The invention of claim 31, wherein the preferred digital state improves power consumption of the memory device.

37. The invention of claim 31, wherein the preferred digital state improves reliability of the memory device.

38. The invention of claim 31, wherein the preferred digital state improves leakage.

39. The invention of claim 31, wherein act (b) is performed by a memory device comprising the memory array.

40. The invention of claim 31, wherein the memory-array is part of a memory device coupled with a host device, and wherein act (b) is performed by the host device.

41. The invention of claim 31, wherein act (c1) is performed by a memory device comprising the memory array.

42. The invention of claim 31, wherein the memory array is part of a memory device coupled with a host device, and wherein act (c1) is performed by the host device.

43. The invention of claim 31, further comprising:
(d) if the plurality of bits comprise more bits in the preferred digital state than in the non-preferred digital state, storing the plurality of bits in the memory array without inverting the plurality of bits.

44. The invention of claim 31, further comprising:
(d) if the plurality of bits comprise an equal number of bits in the preferred digital state and the non-preferred digital state, storing the plurality of bits in the memory array without inverting the plurality of bits.

45. The invention of claim 31, further comprising:
(d) if the plurality of bits comprise an equal number of bits in the preferred digital state and the non-preferred digital state:
  (d1) inverting the plurality of bits; and
  (d2) storing the inverted plurality of bits in the memory array.

46. The invention of claim 31, further comprising:
(c3) storing data in the memory array indicating that the plurality of bits were stored in an inverted state.

47. The invention of claim 31, further comprising:
(c3) reading the inverted plurality of bits from the memory array; and
(c4) inverting the inverted plurality of bits read from the memory array.

48. The invention of claim 31, wherein the plurality of memory cells comprise write-once memory cells, wherein the first digital state comprises an initial un-programmed state of the write-once memory cells, and wherein the: second digital state comprises a programmed state of the write-once memory cells.

49. The invention of claim 31, wherein the memory array comprises a three-dimensional memory array.

50. The invention of claim 31, wherein the plurality of memory cells are made from a semiconductor material.

* * * * *

UNITED STATES PATENT AND TRADEMARK OFFICE
CERTIFICATE OF CORRECTION

PATENT NO.    : 6,563,745 B1
DATED         : May 13, 2003
INVENTOR(S)   : Alper Ilkbahar It is certified that error appears in the above-identified patent and that said Letters Patent is hereby corrected as shown below:

Column 9,
Line 61, delete "digital.states," and substitute -- digital states, -- in its place.
Line 65, immediately after "claim 1" delete "," (comma).
Line 65, immediately after "comprising" delete "," (comma) and substitute -- : -- (colon) in its place.

Column 12,
Line 41, immediately after "wherein the" delete ":" (colon).

Signed and Sealed this

Fourth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.     : 6,563,745 B1
DATED          : May 13, 2003
INVENTOR(S)    : Alper Ilkbahar It is certified that error appears in the above-identified patent and that said Letters Patent is hereby corrected as shown below:

<u>Title page,</u>
Item [56], References Cited, before OTHER PUBLICATIONS, insert the following:
-- FOREIGN PATENT DOCUMENTS
WO 99/14763     3/25/1999     PCT --.

Signed and Sealed this

Twentieth Day of July, 2004

JON W. DUDAS
*Acting Director of the United States Patent and Trademark Office*